US012787314B2

(12) United States Patent
Lee et al.

(10) Patent No.: US 12,787,314 B2
(45) Date of Patent: Nov. 3, 2026

(54) CAPACITOR HAVING DIELECTRIC COMPRISING RUTILE-PHASE TITANIUM OXIDE AND MAGNESIUM, METHOD OF PREPARING THE SAME, AND ELECTRONIC DEVICE INCLUDING THE SAME

(71) Applicant: Samsung Electronics Co., Ltd., Suwon-si (KR)

(72) Inventors: Jooho Lee, Suwon-si (KR); Yong-Hee Cho, Hwaseong-si (KR); Jinhong Kim, Suwon-si (KR); Changsoo Lee, Suwon-si (KR); Sung Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 283 days.

(21) Appl. No.: 18/409,957

(22) Filed: Jan. 11, 2024

(65) Prior Publication Data

US 2024/0243164 A1 Jul. 18, 2024

(30) Foreign Application Priority Data

Jan. 13, 2023 (KR) ........................ 10-2023-0005638
Jan. 10, 2024 (KR) ........................ 10-2024-0004346

(51) Int. Cl.
*H10D 1/68* (2025.01)
*H10B 12/00* (2023.01)
*H10D 1/00* (2025.01)

(52) U.S. Cl.
CPC ........... *H10D 1/694* (2025.01); *H10B 12/315* (2023.02); *H10D 1/042* (2025.01); *H10D 1/696* (2025.01); *H10D 1/716* (2025.01)

(58) Field of Classification Search
CPC ........ H10D 1/694; H10D 1/716; H10D 1/042; H10D 1/696; H10B 12/315
See application file for complete search history.

(56) References Cited

U.S. PATENT DOCUMENTS 8,674,479 B2 3/2014 Chen et al.
8,847,397 B2 9/2014 Malhotra et al.
(Continued)

FOREIGN PATENT DOCUMENTS

KR 10-2007-0106286 A 11/2007
KR 10-2022-0036139 A 3/2022
KR 10-2023-0039440 A 3/2023

OTHER PUBLICATIONS

Extended European Search Report issued Nov. 21, 2024 in European Application No. 24151491.8.
(Continued)

*Primary Examiner* — Michael Jung
(74) *Attorney, Agent, or Firm* — Harness, Dickey & Pierce, P.L.C.

(57) ABSTRACT

Provided are a capacitor, a method of preparing the capacitor, and an electronic device including the capacitor, the capacitor including a lower electrode, an upper electrode spaced apart from the lower electrode, a dielectric between the lower electrode and the upper electrode, a first layer between the lower electrode and the dielectric, and a second layer between the dielectric and the upper electrode, wherein the dielectric comprises $TiO_2$ having a rutile phase and is doped with magnesium, the first layer includes a material having a higher work function than that of a material included in the lower electrode, and the second layer includes a dielectric protective material.

20 Claims, 12 Drawing Sheets

(56) References Cited

U.S. PATENT DOCUMENTS

| | | | | |
|---|---|---|---|---|
| 2012/0261747 | A1* | 10/2012 | Park | H10W 20/072 257/330 |
| 2013/0100577 | A1* | 4/2013 | Popovici | A61B 5/0059 427/79 |
| 2014/0080282 | A1 | 3/2014 | Chiang et al. | |
| 2014/0187015 | A1 | 7/2014 | Rui et al. | |
| 2014/0187016 | A1* | 7/2014 | Malhotra | H10D 1/696 438/381 |
| 2014/0187018 | A1 | 7/2014 | Malhotra et al. | |
| 2017/0084643 | A1 | 3/2017 | Saraf et al. | |
| 2021/0242213 | A1* | 8/2021 | Jiang | H10B 12/34 |
| 2022/0085144 | A1 | 3/2022 | Lee et al. | |
| 2023/0080072 | A1 | 3/2023 | Kim et al. | |

OTHER PUBLICATIONS

Seong Keun Kim et al., "Al-Doped TiO2 Films with Ultralow Leakage Currents for Next Generation DRAM Capacitors", Advanced Materials, Apr. 21, 2008, vol. 20, Issue 8, pp. 1429-1435 (2008).

Seong Keun Kim et al., "Capacitors with an Equivalent Oxide Thickness of < 0.5 nm for Nanoscale Electronic Semiconductor Memory", Advanced Functional Materials, Aug. 23, 2010, vol. 20, Issue 18, pp. 2989-3003 (2010).

* cited by examiner

CAPACITOR HAVING DIELECTRIC COMPRISING RUTILE-PHASE TITANIUM OXIDE AND MAGNESIUM, METHOD OF PREPARING THE SAME, AND ELECTRONIC DEVICE INCLUDING THE SAME

CROSS-REFERENCE TO RELATED APPLICATIONS

This application is based on and claims priority under 35 U.S.C. § 119 to Korean Patent Applications Nos. 10-2023-0005638, filed on Jan. 13, 2023, and 10-2024-0004346, filed on Jan. 10, 2024, in the Korean Intellectual Property Office, the disclosure of which is incorporated by reference herein in its entirety.

BACKGROUND

1. Field

The present disclosure relates to a capacitor, a method of preparing the same, and an electronic device including the same.

2. Description of the Related Art

As electronic apparatuses are downscaled, the space occupied by electronic devices within the electronic apparatuses is also being reduced. Accordingly, along with a reduction in the size of the electronic device (such as a capacitor), a decrease in a thickness of a dielectric layer of the capacitor is required at the same time. However, a structure that satisfies a reference value of leakage current while having a thickness of the dielectric layer suitable for a desired capacitance is difficult to implement, and thus solutions are continuously being sought.

SUMMARY

Provided are a capacitor having improved permittivity and leakage current characteristics, a method of preparing the capacitor, and an electronic device including the capacitor.

Additional aspects will be set forth in part in the description which follows and, in part, will be apparent from the description, or may be learned by practice of the presented embodiments of the disclosure.

According to an aspect of the disclosure, a capacitor includes a lower electrode; an upper electrode spaced apart from the lower electrode; a dielectric between the lower electrode and the upper electrode, the dielectric comprising titanium oxide ($TiO_2$) having a rutile phase and magnesium (Mg); the first layer comprising a material with a work function higher than a work function of a material comprising the lower electrode; and a second layer between the dielectric and the upper electrode, the second layer comprising a dielectric protective material.

The upper electrode and the lower electrode may include titanium nitride.

An amount of Mg in the dielectric may be greater than about 0.5 at % and less than or equal to about 50 at %, based on 100 at % of the dielectric.

The dielectric may further include an additive material, and the additive material may include gallium (Ga), aluminum (Al), lanthanum (La), boron (B), indium (In), scandium (Sc), yttrium (Y), or any combination thereof.

The dielectric may include a $TiO_2$-containing layer and a Mg oxide-containing layer in the $TiO_2$-containing layer.

The work function of the first layer is greater than or equal to about 4.0 eV and less than or equal to about 7.0 eV. The first layer may include a first material, oxide of the first material, nitride of the first material, or any combination thereof and the first material may include molybdenum (Mo), vanadium (V), manganese (Mn), tantalum (Ta), nickel (Ni), tungsten (W), platinum (Pt), palladium (Pd), gold (Au), iridium (Ir), ruthenium (Ru), hafnium (Hf), zirconium (Zr), or any combination thereof.

A thickness of the first layer may be less than or equal to 30 Å.

The second layer may include an oxide of the second material, and the second material may be a combination of Mg and aluminum (Al).

A thickness of the second layer may be less than or equal to 20 Å.

A sum of the thickness of the second layer and the thickness of the dielectric may be less than or equal to 120 Å.

At least one of the lower electrode, the first layer, the dielectric, the second layer and the upper electrode may have an aspect ratio of at least 10:1.

According to another aspect of the disclosure, a method of preparing a capacitor includes forming a lower electrode; forming a first layer on the lower electrode, the first layer comprising a material with work function higher than a work function of a material included in the lower electrode; forming a dielectric on the first layer using an atomic layer deposition (ALD) method, the ALD method including a titanium (Ti)-containing precursor and a magnesium (Mg)-containing precursor such that the dielectric comprising $TiO_2$ having a rutile phase and Mg; forming a second layer on the dielectric, the second layer including a dielectric protective material; and forming an upper electrode on the second layer.

The forming of the dielectric may include sequentially using the Ti-containing precursor, the Mg-containing precursor, and the Ti-containing precursor.

The Mg-containing precursor may include at least one of bis(cyclopentadienyl)magnesium(II) ($Mg(C_5H_5)_2$) or bis(ethylcyclopentadienyl)magnesium ($Mg(C_5H_4C_2H_5)_2$).

According to another aspect of the disclosure, an electronic device includes a transistor, and the capacitor electrically connected to the transistor.

In at least one embodiment, the transistor may include a semiconductor substrate including a source region, a drain region, and a channel region between the source region and the drain region, and a gate stack on the semiconductor substrate, facing the channel region, and including a gate insulating layer and a gate electrode.

In one or more embodiments, the transistor may include a semiconductor substrate including a source region, a drain region, and a channel region being between the source region and the drain region, and a gate stack in a trench in the semiconductor substrate, facing the channel region, and comprising a gate insulating layer and a gate electrode.

The electronic device may include a memory unit including the capacitor and the transistor, and a control unit electrically connected to the memory unit and configured to control the memory unit.

In at least one embodiment, the electronic device may be a dynamic random access memory (DRAM) device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
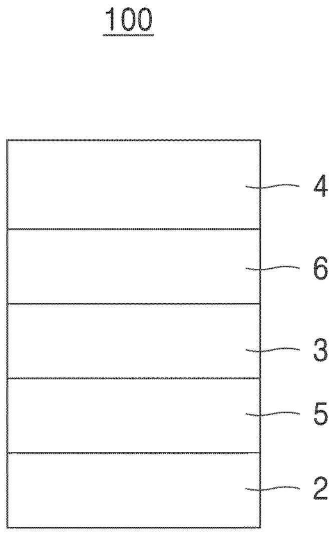
FIG. 1 is a cross-sectional view of a schematic structure of a capacitor according to at least one embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figure, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. Embodiments described below are illustrative examples of embodiments, and various changes in forms and details may be made from such embodiments. In the following drawings, the same reference numerals denote the same components, and the size of each component in the drawings may be exaggerated for clarity and convenience of description.

When the terms "about" or "substantially" are used in this specification in connection with a numerical value and/or geometric terms, it is intended that the associated numerical value includes a manufacturing tolerance (e.g., ±10%) around the stated numerical value. Further, regardless of whether numerical values and/or geometric terms are modified as "about" or "substantially," it will be understood that these values should be construed as including a manufacturing or operational tolerance (e.g., ±10%) around the stated numerical values and/or geometric. When referring to "C to D", this means C inclusive to D inclusive unless otherwise specified.

Hereinafter, when a component or the like is referred to as being "above" or "on" another component, the component can be directly on the other component or above the other component in a non-contact manner. It will also be understood that spatially relative terms, such as "above", "top", etc., are intended to encompass different orientations of the device in use or operation in addition to the orientation depicted in the figures, and that the device may be otherwise oriented (rotated 90 degrees or at other orientations) and the spatially relative terms used herein interpreted accordingly.

Such terms as "first," "second," etc., may be used to describe various components, but are used only to distinguish one component from another. The above terms are not intended to limit the difference in material or structure of the components.

An expression used in the singular encompasses the expression of the plural, unless it has a clearly different meaning in the context. In addition, when a portion "includes" an element, another element may be further included, rather than excluding the existence of the other element, unless otherwise described.

Also, such terms as " . . . unit" or "module" described throughout the specification refers to a unit that processes at least one function or operation, which can be implemented by processing circuitry such as hardware, software, and/or a combination of a hardware and a software. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc., and/or electronic circuits including said components.

The use of the term "the' and similar referents is construed to cover both the singular and the plural.

The steps of methods described herein can be performed in any suitable order unless clearly stated that the steps must be performed in the order described. Also, the use of exemplary language (e.g., such as) provided herein is intended merely to better illuminate technical ideas in detail and does not pose a limitation on the scope of rights unless otherwise claimed.

FIG. 1 is a cross-sectional view of a schematic structure of a capacitor according to at least one embodiment.

A capacitor 100 includes a lower electrode 2, an upper electrode 4 spaced apart from the lower electrode 2, a dielectric 3 between the lower electrode 2 and the upper electrode 4, a first layer 5 between the lower electrode 2 and the dielectric 3, and a second layer 6 between the dielectric 3 and the upper electrode 4. Materials included in the lower electrode 2 and the upper electrode 4 may include conductive materials capable of maintaining stable capacitance performance during and/or after a high-temperature process in manufacturing the capacitor 100.

In at least one embodiment, the upper electrode 4 and/or the lower electrode 2 may include titanium (Ti), nickel (Ni), aluminum (Al), tantalum (Ta), molybdenum (Mo), vanadium (V), niobium (Nb), magnesium (Mg), a combination thereof, and/or the like.

For example, the upper electrode 4 and the lower electrode 2 may each include metal nitride, and metal of the metal nitride may include, for example, at least one of Ti, Ni, Al, Ta, Mo, V, Nb, Mg, and/or a combination thereof.

In one or more embodiments, the upper electrode 4 and the lower electrode 2 may each include titanium nitride, such as TiN.

The upper electrode 4 and the lower electrode 2 may each have a thickness of less than or equal to 300 Å, for example, about 0.1 Å to about 300 Å.

The upper electrode 4 and the lower electrode 2 may each further include, in addition to titanium nitride, ruthenium (Ru), iridium (Ir), Mo, Nb, Ta, antimony (Sb), manganese (Mn), $RuO_2$, $IrO_2$, $MoO_2$, fluorine (F), and/or a combination thereof, to improve permittivity of the dielectric 3.

The dielectric 3 may include $TiO_2$ having a rutile phase. $TiO_2$ has different dielectric constants depending on the phase. For example, $TiO_2$ having an anatase phase exhibits a dielectric constant of about 40, whereas $TiO_2$ having a rutile phase has a large dielectric constant value in a range of about 80 to about 170 according to the growth direction. In this regard, the dielectric 3 including such $TiO_2$ having a rutile phase may have a high dielectric constant.

In addition, the dielectric 3 may include Mg. For example, the dielectric 3 may be doped with Mg. In these cases, the permittivity of the dielectric 3 is not substantially reduced, while a conduction band offset (CBO) between the lower electrode 2 and the dielectric 3 is improved, thereby improving leakage current characteristics of the capacitor 100.

As the dielectric 3 includes Mg (for example, the dielectric 3 is doped with Mg), the dielectric 3 may include Mg itself, a Mg-containing compound (e.g., magnesium oxide) in which Mg is combined with other atoms (e.g., oxygen, etc.), and/or a combination thereof.

For example, the dielectric 3 may include, as a matrix material, $TiO_2$ having a rutile phase, and Mg, Mg oxide, and/or a combination thereof may be present in $TiO_2$.

In at least one embodiment, an amount of Mg in the dielectric 3 may be, based on 100 at % of the dielectric 3, greater than about 0.5 at % and less than or equal to about 50 at %, greater than about 0.5 at % and less than or equal to about 40 at %, or greater than about 0.5 at % and less than or equal to about 30 at %. When the amount of Mg in the dielectric 3 is satisfied within the range above, the permittivity of the dielectric 3 and the CBO characteristics between the dielectric 3 and the lower electrode 2 may be improved simultaneously and effectively. In one or more embodiments, the dielectric 3 may further include, in addition to the aforementioned Mg, an additive material to improve the dielectric constant, promote crystallization of $TiO_2$ having a rutile phase, and/or the like. For example, the additive material may include at least one of gallium (Ga), Al, lanthanum (La), boron (B), indium (In), scandium (Sc), yttrium (Y), and/or a combination thereof. In one or more embodiments, the additive material may include at least one of Al and Al oxide. An amount of the additive material may be, based on atomic percentage of the dielectric 3 (aside from oxygen), greater than about 0 at % and less than or equal to about 50 at %, greater than about 0 at % and less than or equal to about 40 at %, greater than about 0 at % and less than or equal to about 30 at %, greater than about 0 at % and less than or equal to about 20 at %, or greater than about 0 at % and less than or equal to about 10 at %.

In one or more embodiments, the dielectric 3 may be a thin film having a thickness of less than or equal to 100 Å, for example, about 1 Å to about 100 Å.

In one or more embodiments, the dielectric 3 may include a $TiO_2$-containing layer, and a Mg oxide-containing layer in the $TiO_2$-containing layer. For example, the dielectric 3 may include a $TiO_2$-containing layer and a Mg oxide-containing layer, and the Mg oxide-containing layer may be inserted in the $TiO_2$-containing layer. For example, the dielectric 3 may have a structure in which $TiO_2$-containing layer A, a Mg oxide-containing layer, and $TiO_2$-containing layer B are sequentially stacked from the lower electrode 2. In at least some embodiments, each of the TiO containing layer A and the $TiO_2$-containing layer B may not include Mg and/or Mg oxide. In addition, the Mg oxide in the Mg oxide-containing layer may have a concentration gradient that decreases toward the interface between the $TiO_2$-containing layer A and the Mg oxide-containing layer and the interface between the Mg oxide-containing layer and the $TiO_2$-containing layer B.

The first layer 5 may include a material having a higher work function than that of a material included in the lower electrode 2. Accordingly, in these cases the CBO between the dielectric 3 and the lower electrode 2 increases so that the leakage current characteristics of the capacitor 100 may be improved, and the crystallization of $TiO_2$ having a rutile phase in the dielectric 3 is promoted so that the dielectric constant of the dielectric 3 may be improved.

For example, the first layer 5 may include a material having a work function of greater than or equal to about 4.0 eV and less than or equal to about 7.0 eV.

In one or more embodiments, the first layer 5 may include a first material, oxide of the first material, nitride of the first material, and/or a combination thereof, and the first material may include Mo, V, Mn, Ta, Ni, W, Pt, Pd, Au, Ir, Ru, Hf, Zr, or any combination thereof. In one or more embodiments, the first layer 5 may include at least one of molybdenum oxide and vanadium oxide. In one or more embodiments, the first layer 5 may include hafnium-zirconium oxide (HZO). A thickness of the first layer 5 may be less than or equal to 30 Å, for example, about 1 Å to about 30 Å. When the thickness of the first layer 5 is satisfied within the ranges above, the improvement of CBO between the dielectric 3 and the lower electrode 2 and/or the promotion of crystallization of $TiO_2$ into a rutile phase in dielectric 3 may be effectively achieved.

In one or more embodiments, the thickness of the first layer 5 may be less than or equal to 10% of the thickness of the lower electrode 2.

The second layer 6 may serve to protect the dielectric 3, improve the CBO between the dielectric 3 and the upper electrode 4, and/or reduce the leakage current. The second layer 6 may include a dielectric protective material. The dielectric protective material protects the dielectric 3 (e.g., during the deposition of the upper electrode 4 and/or from diffusion between the upper electrode 4 and the dielectric 3), and reduces the leakage current simultaneously.

For example, the second layer 6 may include oxide of a second material, and the second material may be a combination of Mg and Al. For example, the second layer 6 may include Mg oxide doped with Al.

In one or more embodiments, the second layer 6 may include $Mg_xAl_yO_z$ (wherein $x+y+z=1$, $0<x<0.3$, $0.16<y<0.4$, and $0.54<z<0.6$). An energy gap of $Mg_xAl_yO_z$ may be greater than that of $Al_2O_3$. Here, x, y, and z each represent at %.

A thickness of the second layer 6 may be less than or equal to 20 Å, for example, about 1 Å to about 20 Å. When the thickness of the second layer 6 is satisfied within the ranges above, the improvement of CBO between the dielectric 3 and the upper electrode 4 and/or the protection of the dielectric 3 may be effectively achieved.

In one or more embodiments, the sum of the thickness of the second layer 6 and the thickness of the dielectric 3 may be less than or equal to 120 Å, for example, about 3 Å to about 100 Å.

Figure 8:
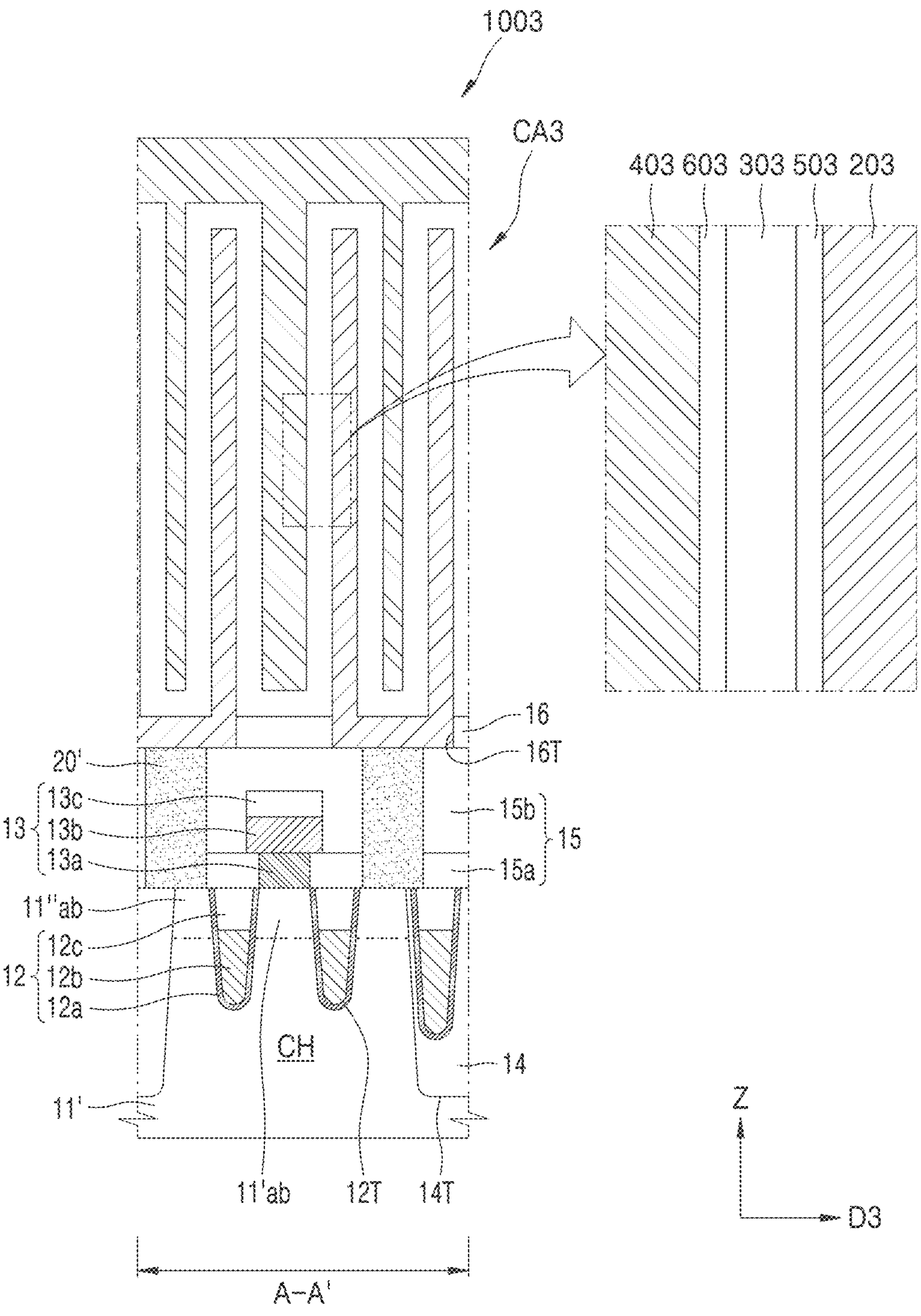
FIG. 8 is a cross-sectional view taken along line A-A' of FIG. 7.

At least one of the lower electrode 2, the first layer 5, the dielectric 3, the second layer 6 and the upper electrode 4 may have an aspect ratio of at least 10:1, for example, about 10:1 to about 1000:1. In one or more embodiments, at least one of the lower electrode 2, the first layer 5, the dielectric 3, the second layer 6 and the upper electrode 4 may each have a structure with a three-dimensional pattern having an aspect ratio of at least 10:1, for example, about 10:1 to about 1000:1. For example, the lower electrode 203, the first layer 503, the dielectric 303, the second layer 603 and the upper electrode 403 in FIG. 8 described hereinafter have a structure with a three-dimensional pattern as shown in FIG. 8. The structure with a three-dimensional pattern may have an aspect ratio of at least 10:1, for example, about 10:1 to about 1000:1.

A method of preparing the capacitor 100 may include:

forming a lower electrode 2 on a substrate;

forming a first layer 5 on the lower electrode 2, the first layer 5 including a material having a higher work function than that of a material included in the lower electrode 2;

forming a dielectric 3 on the first layer 5 by, e.g., an atomic layer deposition (ALD) method using a Ti-containing precursor and a Mg-containing precursor, the dielectric 3 i) including TiO having a rutile phase and ii) being doped with Mg;

forming a second layer 6 on the dielectric 3, the second layer 6 including a dielectric protective material, and forming an upper electrode 4 on the second layer 6.

The substrate may be a part of various electronic devices on which the capacitor 100 is to be formed. The electronic device may be, for example, an electronic device including a transistor. The electronic device may be understood by referring to the related description to be presented later.

In at least one embodiment, the forming of the dielectric 3 may be performed by the ALD method sequentially using a Ti-containing precursor, an Mg-containing precursor, and a Ti-containing precursor.

For example, the Ti-containing precursor may include at least one of a Ti-containing alkoxide (e.g., Ti-tetra-isopropoxide (TTIP), pentamethyl cyclopentadienyl titanium trimethoxide ($Ti(CpMe_5)(OMe)_3$), etc.), a Ti-containing amine (e.g., tetra-kis(dimethylamino)titanium (TDMAT), etc.), a Ti-containing halide (e.g., $TiCl_4$, $TiI_4$, etc.), a combination thereof, and/or the like.

In one or more embodiments, the Mg-containing precursor may include bis(cyclopentadienyl)magnesium(II) ($MgCp_2$, ($Mg(C_5H_5)_2$), bis(ethylcyclopentadienyl)magnesium ($Mg(EtCp)_2$, ($Mg(C_5H_4C_2H_5)_2$)), a combination thereof, and/or the like.

An amount of each of the Ti-containing precursor and the Mg-containing precursor being used may be selected within a range satisfying the amount range of Mg in the dielectric 3 described herein.

Figure 2A:
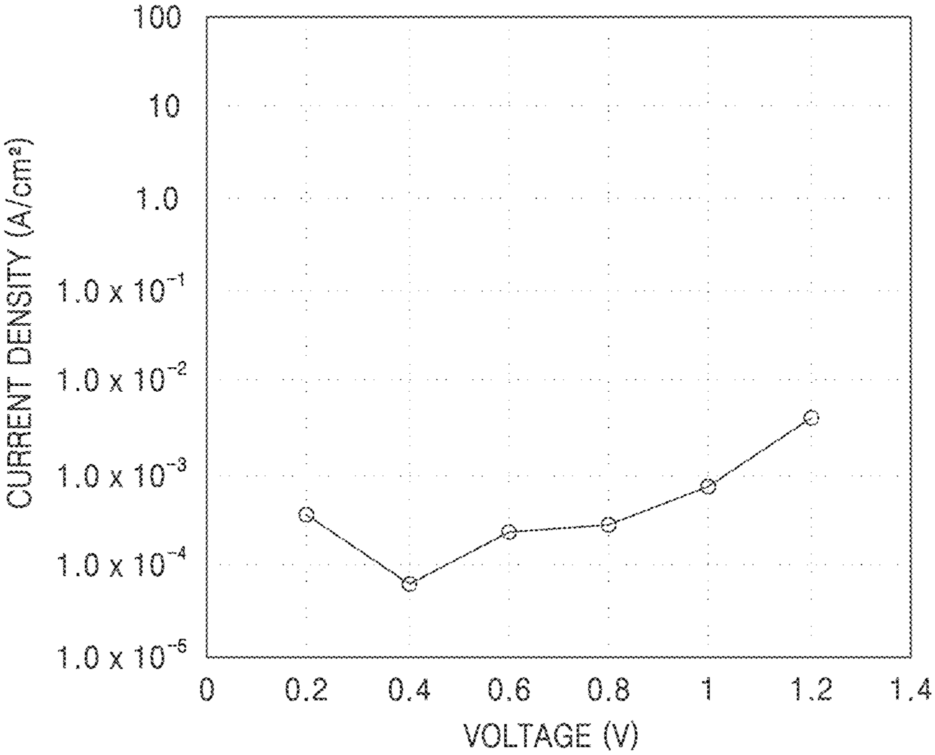
FIG. 2A is a voltage-current density curve of Capacitor 1.
Figure 2B:
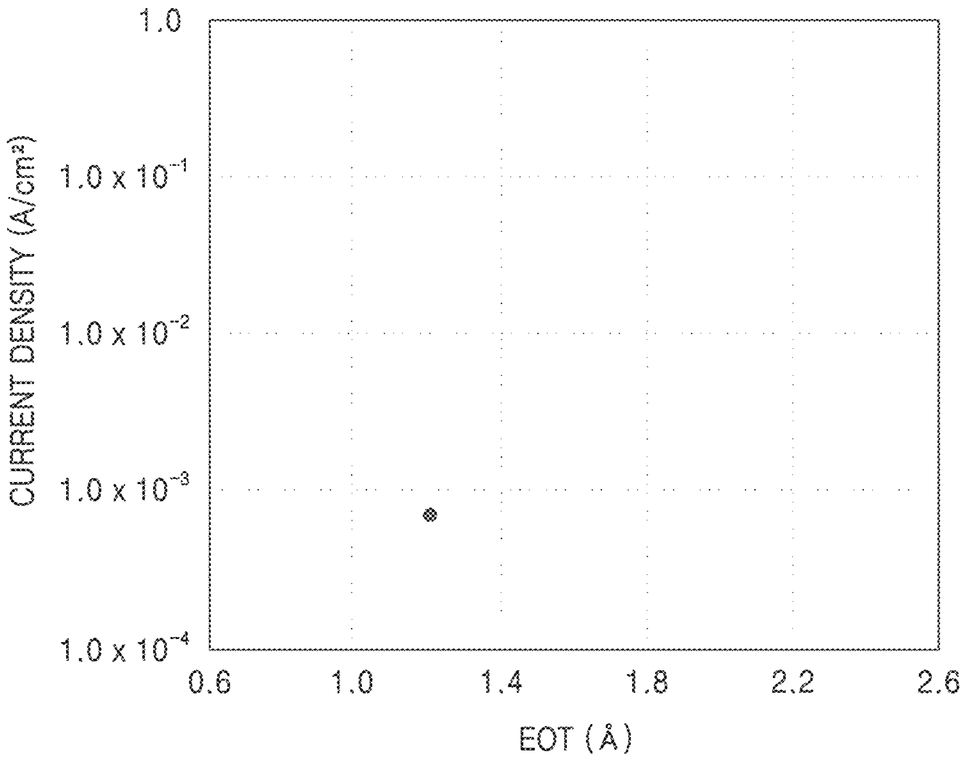
FIG. 2B is a diagram showing current density according to effective oxide thickness (EOT) for Capacitor 1.

FIG. 2A is a voltage-current density curve of Capacitor 1, and FIG. 2B is a diagram showing current density according to effective oxide thickness (EOT) for Capacitor 1. Capacitor 1, which is at least one embodiment of the capacitor 100, has a structure of lower electrode 2/first layer 5/dielectric 3/second layer 6/upper electrode 4 comprising TiN/Mo oxide/Mg-doped rutile-$TiO_2$/Mg-doped $Al_2O_3$/TiN in the stated order. Referring to FIGS. 2A and 2B, Capacitor 1 is confirmed to have excellent leakage current characteristics.

Figure 3:
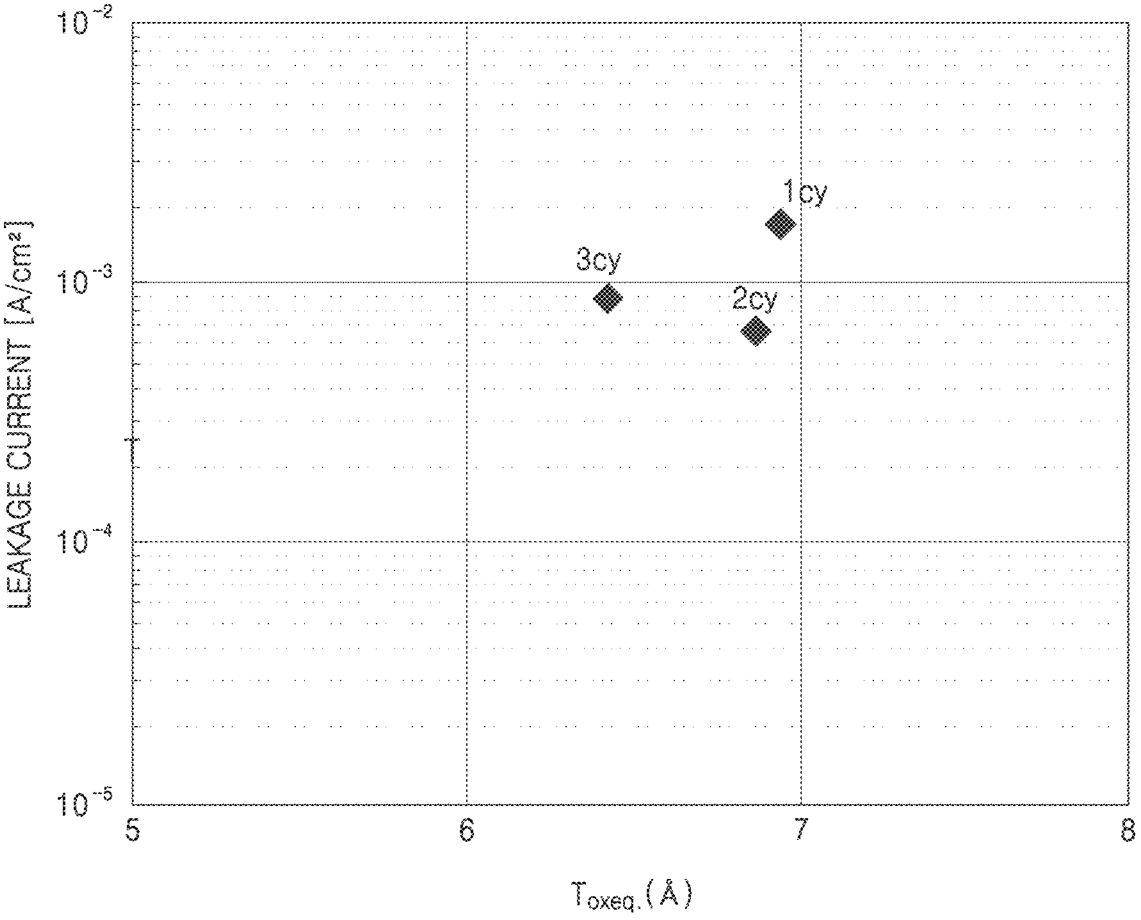
FIG. 3 is a diagram showing leakage current according to Toxeq. (an equivalent oxide thickness) for Capacitor 2.

FIG. 3 is a diagram showing leakage current according to Toxeq. for Capacitor 2. "1cy", "2cy" and "3cy" represent a number of a deposition cycle for preparing the dielectric 3 of Capacitor 2. Capacitor 2, which is at least one embodiment of the capacitor 100, has a structure of lower electrode 2/first layer 5/dielectric 3/second layer 6/upper electrode 4 comprising TiN/Hafnium-Zirconium Oxide (HZO)/Mg-doped rutile-$TiO_2$/Mg-doped $Al_2O_3$/TiN in the stated order. Referring to FIG. 3, Capacitor 2 is confirmed to have both excellent leakage current characteristics and reduced Toxeq. characteristics.

Figure 4:
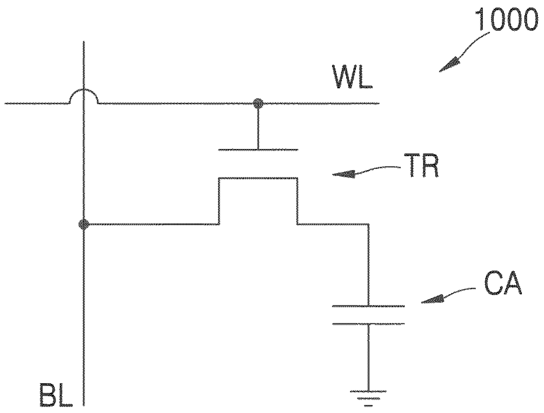
FIG. 4 is a circuit diagram illustrating a schematic circuit configuration and operation of an electronic device including a capacitor according to at least one embodiment.

The capacitor 100 may be applicable to various electronic devices. For example, the capacitor 100 may be utilized in a dynamic random access memory (DRAM) along with the transistor. In addition, together with other circuit elements, the capacitor 100 may constitute an electronic circuit constituting an electronic device. FIG. 4 is a circuit diagram illustrating a schematic circuit configuration and operation of an electronic device including a capacitor according to at least one embodiment.

The circuit diagram of an electronic device 1000 is for a single cell of a DRAM device, and includes a single transistor (TR), a single capacitor (CA), a wordline (WL), and a bitline (BL). The capacitor CA may be the capacitor 100 described in FIGS. 1 to 3.

The data writing operation of the DRAM is as follows. After a gate voltage (high) is applied to a gate electrode through the wordline WL to turn "on" the transistor TR, a voltage, VDD (high) or 0 (low), which is a voltage value of data to be input on the bitline BL is applied. When a high voltage is applied to the wordline WL and the bitline BL, the capacitor CA is charged and data "1" is recorded. When a high voltage is applied to the wordline WL and a low voltage is applied to the bitline BL, the capacitor CA is discharged and data "0" is recorded.

For the data reading operation, a high voltage is applied to the wordline WL to turn on the transistor TR of the DRAM, and then a voltage of VDD/2 is applied to the bitline BL. For example, when data written in the DRAM is "1" (e.g., in a case where a voltage of the capacitor CA is VDD), a voltage of the bitline BL becomes slightly higher than VDD/2 as charges transfer from the capacitor CA to the bitline BL. Meanwhile, when data written in the DRAM is "0", a voltage of the bitline BL becomes slightly lower than VDD/2 as charges transfer from the bitline BL to the capacitor CA. Then, when a potential difference thus generated in the bitline BL is sensed by a sense amplifier and is amplified, the corresponding data can be determined as "0" or "1".

Figure 5:
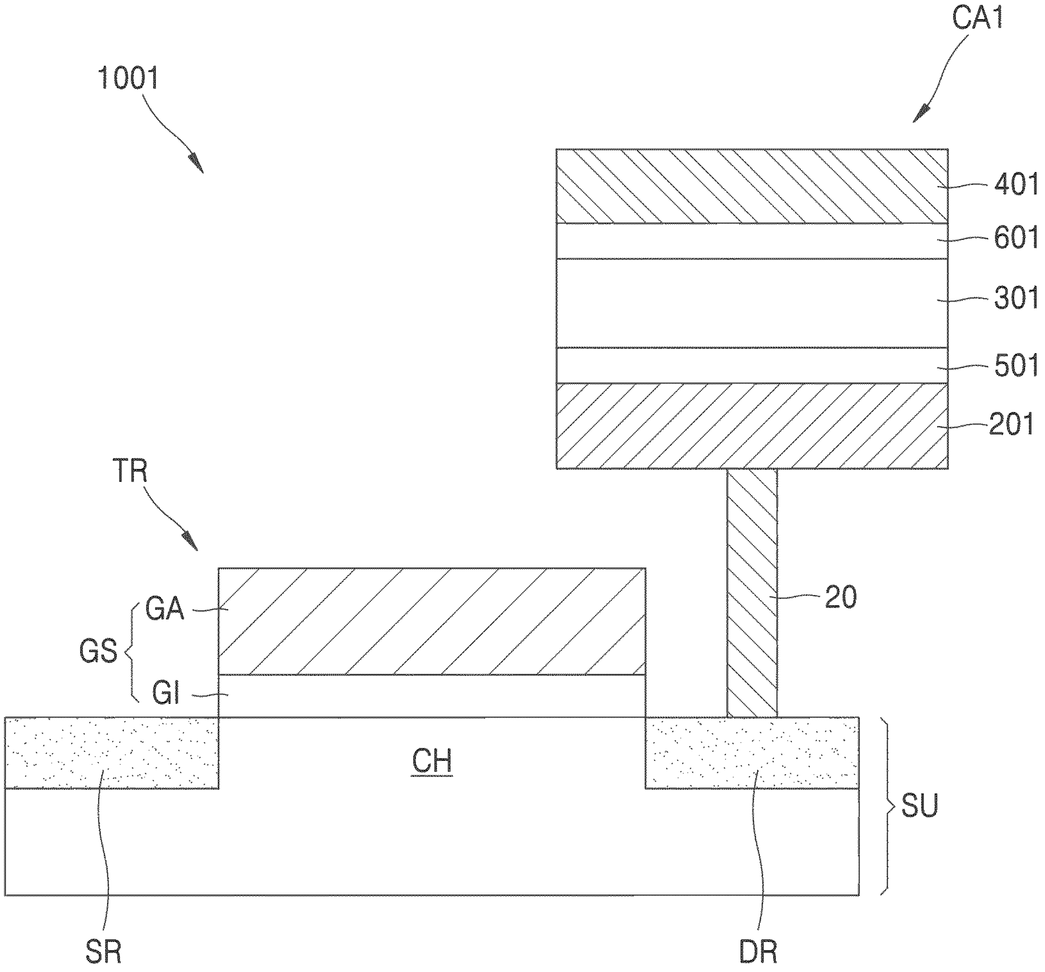
FIG. 5 is a schematic view of an electronic device according to at least one embodiment.

FIG. 5 is a schematic view of an electronic device according to at least one embodiment.

Referring to FIG. 5, an electronic device 1001 may have a structure in which a capacitor CA1 and a transistor TR are electrically connected to each other through a contact 20. The capacitor CA1 includes a lower electrode 201, an upper electrode 401 spaced apart from the lower electrode 201, a dielectric 301 between the lower electrode 201 and the upper electrode 401, a first layer 501 between the lower electrode 201 and the dielectric 301, and a second layer 601 between the dielectric 301 and the upper electrode 401. The capacitor CA1 may be the capacitor 100 as described in FIGS. 1 to 3, and thus a description thereof will be omitted.

The transistor TR may be a field effect transistor. The transistor TR may include: a semiconductor substrate SU including a source region SR, a drain region DR, and a channel region CH; and a gate stack GS including a gate insulating layer GI and a gate electrode GA that are disposed to face the channel region CH on the semiconductor substrate SU. The channel region CH is a region between the source region SR and the drain region DR, and is electrically connected to the source region SR and the drain region DR. The source region SR may be electrically connected to or in contact with one end of the channel region CH, and the drain region DR may be electrically connected to or in contact with the other end of the channel region CH. The channel region CH may be defined as a substrate region between the source region SR and the drain region DR of the semiconductor substrate SU.

The semiconductor substrate SU may include a semiconductor material. The semiconductor substrate SU may include, for example, an elemental and/or a compound semiconductor material such as silicon (Si), germanium (Ge), silicon germanium (SiGe), silicon carbide (SiC), gallium aresenide (GaAs), indium aresenide (InAs), indium phosphide (InP), and/or the like. In addition, the semiconductor substrate SU may include a silicon on insulator (SOI) substrate.

In at least one embodiment, the source region SR, the drain region DR, and the channel region CH may each independently be formed by injecting impurities into different regions of the semiconductor substrate SU. In these cases, the source region SR, the channel region CH, and the drain region DR each include the substrate material as a base material. The source region SR and the drain region DR may each be formed of (and/or include) a conductive material. In these cases, the source region SR and the drain region DR may each include, for example, metal, metal compound, conductive polymer, and/or the like.

Unlike the drawing, the channel region CH may be implemented as a separate material layer (thin film). In these cases, the channel region CH may include, for example, at least one of Si, Ge, SiGe, a Group III-V semiconductor, an oxide semiconductor, a nitride semiconductor, an oxynitride semiconductor, a two-dimensional (2D) material, a quantum dot, an organic semiconductor, and/or the like. For example, the oxide semiconductor may include InGaZnO, the 2D material may include transition metal dichalcogenide (TMD) or graphene, and/or the quantum dot may include a colloidal quantum dot or a nanocrystal structure.

The gate electrode GA may be disposed on the semiconductor substrate SU to be spaced apart from the semiconductor substrate SU and face the channel region CH. The gate electrode GA may include at least one of metal, metal nitride, metal carbide, polysilicon, and/or the like. For example, the metal may include at least one of Al, W, Mo, Ti, and Ta; the metal nitride may include at least one of a Ti nitride (TiN) and a Ta nitride (TaN); and/or the metal carbide may include at least one metal carbide doped (or containing) with Al and/or Si. For example, the metal carbide may include TiAlC, TaAlC, TiSiC, TaSiC, and/or the like.

The gate electrode GA may have a structure comprising a single layer and/or a structure in which multiple materials are stacked. For example, the gate electrode GA may have a stacked structure of metal nitride layer/metal layer, such as TiN/Al, and/or a stacked structure of metal nitride layer/metal carbide layer/metal layer, such as TiN/TiAlC/W. The aforementioned materials used for the gate electrode GA are merely examples and the example embodiments are not limited thereto.

The gate insulating layer GI may be further disposed between the semiconductor substrate SU and the gate electrode GA. The gate insulating layer GI may include a paraelectric material or a high-k dielectric material, and may have dielectric constant of about 20 to about 70.

The gate insulating layer GI may include an insulator material, such as silicon oxide, silicon nitride, aluminum oxide, hafnium oxide, zirconium oxide, a 2D insulator such as hexagonal boron nitride (h-BN), and/or the like. For example, the gate insulating layer GI may include silicon oxide ($SiO_2$), silicon nitride ($SiN_x$), hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide (TiO), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobate (PbZnNbO) metal nitride oxide (such as aluminum oxynitride (AlON), zirconium oxynitride (ZrON), hafnium oxynitride (HfON), lantanium oxynitride (LaON), and/or yttrium oxynitride (YON)), silicate (such as ZrSiON, HfSiON, YSiON, and/or LaSiON), and/or aluminate (such as ZrAlON or HfAlON). The gate insulating layer GI may constitute a gate stack together with the gate electrode GA.

One of the electrodes 201 and 401 of the capacitor CA1 may be electrically connected to one of the source region SR and the drain region DR of the transistor TR, e.g., through the contact 20. Here, the contact 20 may include a suitable conductive material, such as tungsten, copper, aluminum, polysilicon, and the like.

The dispose of the capacitor CA1 and the transistor TR may be variously modified. For example, the capacitor CA1 may have a structure disposed on the semiconductor substrate SU or a structure embedded in the semiconductor substrate SU.

FIG. 5 shows the electronic device 1001 including one capacitor CA1 and one transistor TR, but is only at least one embodiment. The electronic device 1001 may include multiple capacitors and multiple transistors.

Figure 6:
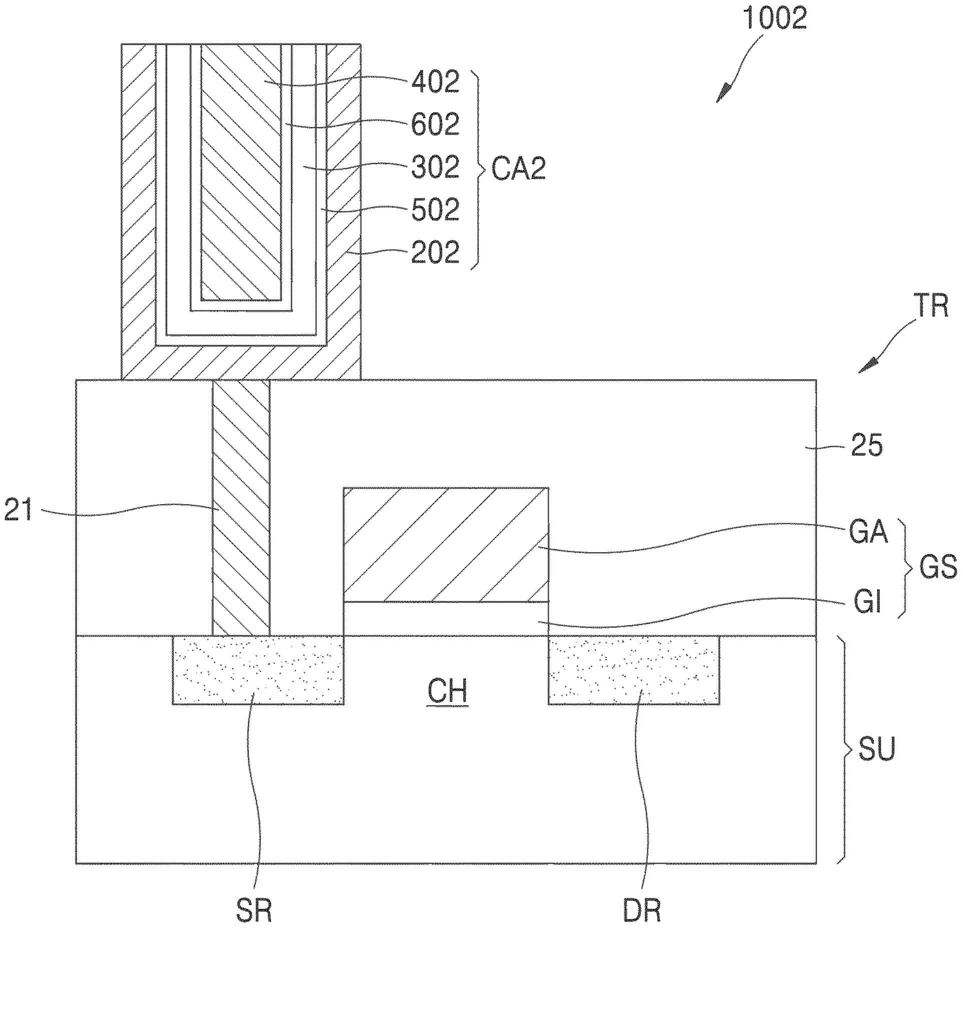
FIG. 6 is a schematic view of an electronic device according to at least one embodiment.

FIG. 6 shows an electronic device according to at least one embodiment.

Referring to FIG. 6, an electronic device 1002 may have a structure in which a capacitor CA2 and a transistor TR are electrically connected to each other through a contact 21.

The transistor TR may include: a semiconductor substrate SU including a source region SR, a drain region DR, and a channel region CH; and a gate stack GS being on the semiconductor substrate SU, facing the channel region CH, and including a gate insulating layer GI and a gate electrode GA.

An inter-insulating layer 25 may be provided on the semiconductor substrate SU to cover the gate stack GS. The inter-insulating layer 25 may include an insulating material. For example, the inter-insulating layer 25 may include Si oxide (e.g., $SiO_2$), Al oxide (e.g., $Al_2O_3$), and/or a high-k dielectric material (e.g., $HfO_2$). The contact 21 passes through the inter-insulating layer 25 to electrically connect the transistor TR and the capacitor CA2 to each other.

The capacitor CA2 includes a lower electrode 202, an upper electrode 402 spaced apart from the lower electrode 202, a dielectric 302 between the lower electrode 202 and the upper electrode 402, a first layer 502 between the lower electrode 202 and the dielectric 302, and a second layer 602 between the dielectric 302 and the upper electrode 402. The lower electrode 202 and the upper electrode 402 may be provided in a shape that can maximize a contact area with the first layer 502, the dielectric 302, and the second layer 602, and a material for forming the capacitor CA2 may be the same and/or substantially similar as a material for forming the aforementioned capacitor 100 of FIGS. 1 to 3.

Figure 7:
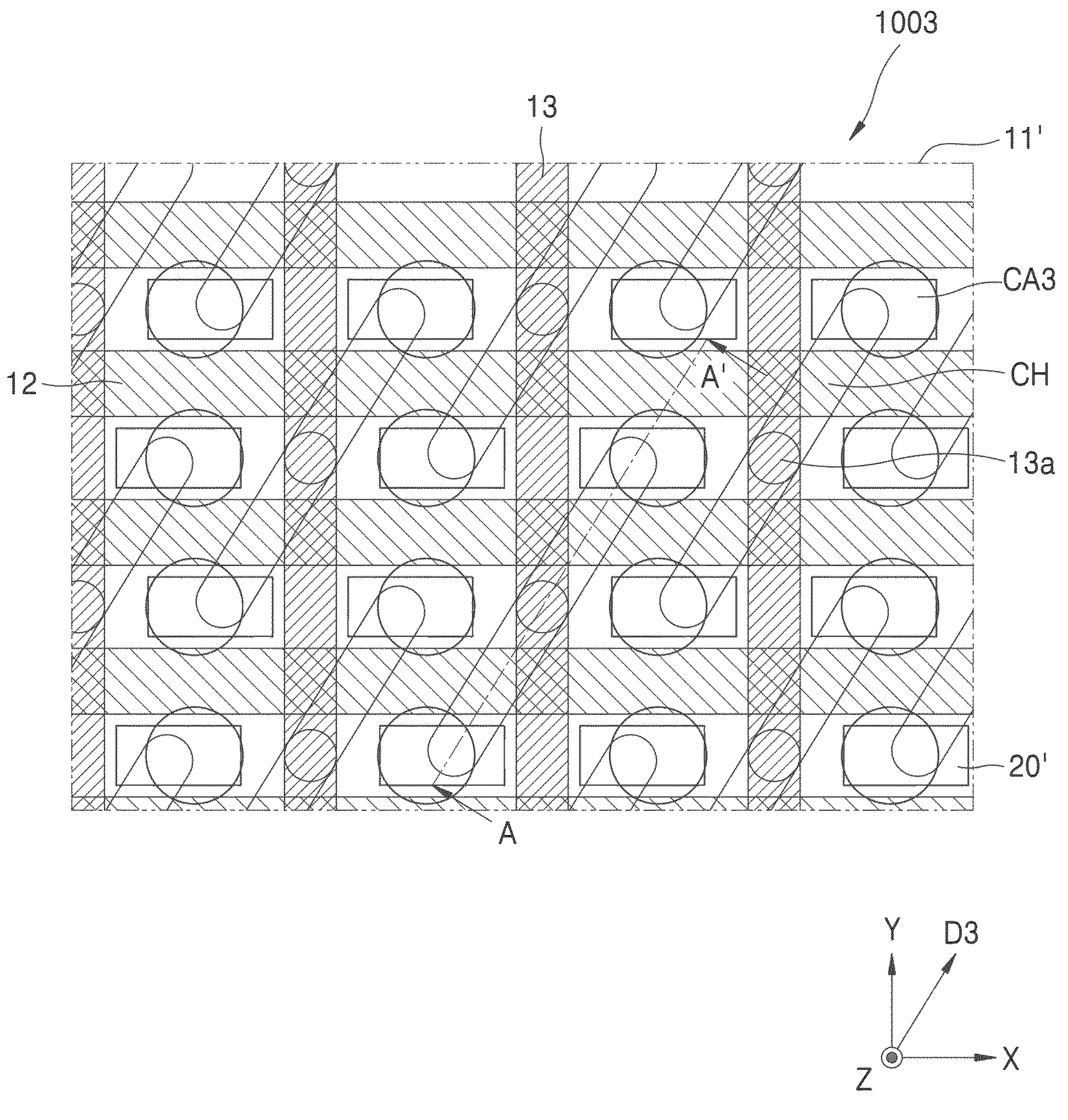
FIG. 7 is a plan view of an electronic device according to at least one embodiment.

FIG. 7 is a plan view of an electronic device according to at least one embodiment.

Referring to FIG. 7, an electronic device 1003 may have a structure in which multiple capacitors and multiple field effect transistors are repeatedly disposed. The electronic device 1003 may include a field effect transistor including a semiconductor substrate 11', which includes a source, a drain, and a channel, a gate stack 12, a contact structure 20' disposed on the semiconductor substrate 11' so as not to overlap with the gate stack 12, a capacitor CA3 disposed on the contact structure 20', and a bitline structure 13 electrically connecting multiple field effect transistors together.

FIG. 7 shows at least one embodiment of a form in which both the contact structure 20' and the capacitor CA3 are repeatedly arranged along the X and Y directions, but the form is not limited thereto. For example, the contact structure 20' may be disposed along the X and Y directions, and the capacitor CA3 may be disposed in a hexagonal shape such as a honeycomb structure.

FIG. 8 is a cross-sectional view taken along line A-A' of FIG. 7.

Referring to FIG. 8, the semiconductor substrate 11' may have a shallow trench isolation (STI) structure including a device separation membrane 14. The device separation membrane 14 may be a single layer formed of one type of an insulating film, or a multi-layer formed of a combination of two or more insulating films. The device separation membrane 14 may include a device separation trench 14T in the semiconductor substrate 11', and the device separation trench 14T may be filled with an insulating material. The insulating material may include at least one of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and tonen silazene (TOSZ), but is not limited thereto.

The semiconductor substrate 11' may further include a channel region CH defined by the device separation membrane 14, and a gate line trench 12T disposed to be parallel to an upper surface of the semiconductor substrate 11' and extend in the X direction. The channel region CH may have a relatively long island shape having short and long axes. As shown in FIG. 7, the long axis of the channel region CH may be disposed along a direction D3 parallel to the upper surface of the semiconductor substrate 11'.

The gate line trench 12T may be disposed to cross the channel region CH at a desired and/or alternatively predetermined depth from the upper surface of the semiconductor substrate 11', or may be disposed in the channel region CH. The gate line trench 12T may also be disposed inside the device separation trench 14T, and a bottom surface of the gate line trench 12T inside the device separation trench 14T may be lower than that of the gate line trench 12T of the channel region CH. A first source/drain 11'*ab* and a second source/drain 11"*ab* may be disposed on an upper portion of the channel region CH positioned on both sides of the gate line trench 12T.

The gate stack 12 may be disposed inside the gate line trench 12T. In detail, a gate insulating layer 12*a*, a gate electrode 12*b*, and a gate capping layer 12*c* may be sequentially disposed inside the gate line trench 12T. The gate insulating layer 12*a* and the gate electrode 12*b* may be understood by referring to the descriptions above, and the gate capping layer 12*c* may include at least one of silicon oxide, silicon oxynitride, and silicon nitride. The gate capping layer 12*c* may be disposed on the gate electrode 12*b* to fill the remaining portion of the gate line trench 12T. A bitline structure 13 may be disposed on the first source/drain 11'ab. The bitline structure 13 may be disposed to be parallel to the upper surface of the semiconductor substrate 11' and to extend along the Y direction. The bitline structure 13 may be electrically connected with the first source/drain 11'*ab*, and may include a bitline contact 13*a*, a bitline 13*b*, and a bitline capping layer 13*c* that are sequentially stacked. For example, the bitline contact 13*a* may include polysilicon, the bitline 13*b* may include a metal material, and the bitline capping layer 13*c* may include an insulating material such as silicon nitride or silicon oxynitride. FIG. 8 shows a case where a bottom surface of the bitline contact 13*a* is at the same level as the upper surface of the semiconductor substrate 11', but is only at least one embodiment and is not limited thereto. For example, in one or more embodiments, a recess formed to a desired and/or alternatively predetermined depth from the upper surface of the semiconductor substrate 11' may be further provided, and the bitline contact 13*a* may extend into the recess. Thus, a bottom surface of the bitline contact 13*a* may be formed lower than the upper surface of the semiconductor substrate 11'.

The bitline structure 13 may further include a bitline interlayer (not shown) between the bitline contact 13*a* and the bitline 13*b*. The bitline interlayer may include metal silicide such as tungsten silicide, or metal nitride such as tungsten nitride. In addition, a bitline spacer (not shown) may be further formed on a sidewall of the bitline structure 13. The bitline spacer may have a single-layer structure or a multi-layer structure, and may include an insulating material, such as silicon oxide, silicon oxynitride, or silicon nitride. In addition, the bitline spacer may further include an air space (not shown).

The contact structure 20' may be disposed on the second source/drain 11"*ab*. The contact structure 20' and the bitline structure 13 may be disposed on different sources/drains on the substrate, respectively. The contact structure 20' may have a structure in which a lower contact pattern (not shown), a metal silicide layer (not shown), and an upper contact pattern (not shown) are sequentially stacked on the second source/drain 11"*ab*. The contact structure 20' may further include a barrier layer (not shown) surrounding side surfaces and a bottom surface of the upper contact pattern. For example, the lower contact pattern may include polysilicon, the upper contact pattern may include a metal material, and the barrier layer may include metal nitride having conductivity.

The capacitor CA3 may be electrically connected with the contact structure 20' to be disposed on the semiconductor substrate 11'. For example, capacitor CA3 may include a lower electrode 203 electrically connected with the contact structure 20', an upper electrode 403 spaced apart from the lower electrode 203, a dielectric 303 between the lower electrode 203 and the upper electrode 403, a first layer 503 disposed between the lower electrode 203 and the dielectric 303, and a second layer 603 between the dielectric 303 and the upper electrode 403. The lower electrode 203 may have a cylindrical shape or a cup shape with an inner space closed at the bottom. The upper electrode 403 may have a comb shape with comb teeth extending into the inner space formed by the lower electrode 203 and a region between the adjacent lower electrodes 203. The first layer 503, the dielectric 303, and the second layer 603 may be disposed between the lower electrode 203 and the upper electrode 403 to be parallel to surfaces thereof.

Materials for forming the lower electrode 203, the first layer 503, the dielectric 303, the second layer 603, and the upper electrode 403 that constitute the capacitor CA3 are the same and/or substantially similar as the materials for forming the capacitor 100 as described in FIGS. 1 to 3, and thus a description thereof will be omitted.

An inter-insulating layer 15 may be further disposed between the capacitor CA3 and the semiconductor substrate 11'. The inter-insulating layer 15 may be disposed in a space where no other structure is disposed between the capacitor CA3 and the semiconductor substrate 11'. In detail, the inter-insulating layer 15 may be disposed to cover the wiring and/or electrode structure of the bitline structure 13, the contact structure 20', the gate stack 12, and the like on the substrate. For example, the inter-insulating layer 15 may surround walls of the contact structure 20'. The inter-insulating layer 15 may include a first inter-insulating layer 15*a* surrounding the bitline contact 13*a* and a second inter-insulating layer 15*b* covering side surfaces and/or upper surfaces of a bitline 13*b* and a bitline capping layer 13*c*.

The lower electrode 203 of the capacitor CA3 may be disposed on the inter-insulating layer 15, more particularly, on the second inter-insulating layer 15*b*. In addition, when multiple capacitors CA3 are disposed, bottom surfaces of multiple lower electrodes 203 may be separated by an etch-stop layer 16. In other words, the etch-stop layer 16 may include an opening 16T, and the bottom surface of the lower electrode 203 of the capacitor CA3 may be disposed in the opening 16T. The lower electrode 203 may have, as illustrated in the drawing, a cylindrical shape or a cup shape with an inner space closed at the bottom. The capacitor CA3 may further include a support (not shown) that prevents the lower electrode 203 from tilting or falling, and such a support may be disposed on a sidewall of the lower electrode 203.

Figure 9:
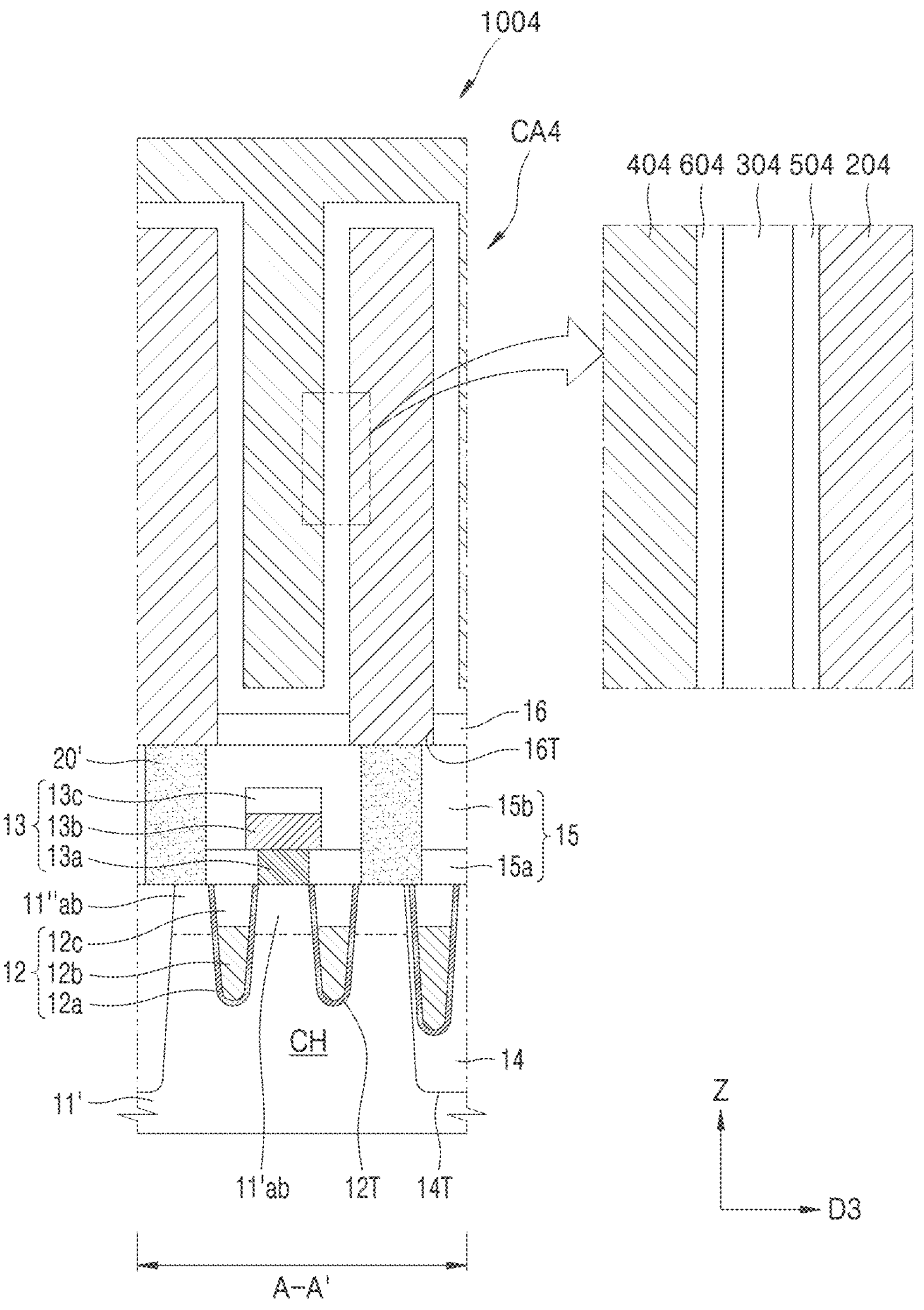
FIG. 9 is a cross-sectional view of an electronic device according to at least one embodiment.

FIG. 9 is a cross-sectional view of an electronic device according to at least one embodiment.

An electronic device 1004 of this embodiment is shown in a cross-sectional view corresponding to the cross-sectional view taken along line A-A' of FIG. 7, and differs from the electronic device of FIG. 8 only in the shape of a capacitor CA4. The capacitor CA4 is electrically connected with the contact structure 20' to be disposed on the semiconductor substrate 11', and includes a lower electrode 204 that is electrically connected with the contact structure 20', an upper electrode 404 that is spaced apart from the lower electrode 204, a dielectric 304 that is disposed between the lower electrode 204 and the upper electrode 404, a first layer 504 that is disposed between the lower electrode 204 and the dielectric 304, and a second layer 604 that is disposed between the dielectric 304 and the upper electrode 404. Materials for forming the lower electrode 204, the first layer 504, the dielectric 304, the second layer 604, and the upper electrode 404 are the same and/or substantially similar as the materials for forming the aforementioned capacitor 100 of FIGS. 1 to 3.

The lower electrode 204 may have a pillar shape, such as a cylinder, a quadrangular pillar, or a polygonal column, that extends in a vertical direction (Z-direction). The upper electrode 404 may have a comb shape with comb teeth extending into a region between the adjacent lower electrodes 204. The first layer 504, the dielectric 304, and the second layer 604 may be disposed between the lower electrode 204 and the upper electrode 404 to be parallel to surfaces thereof. The capacitors and the electronic devices according to some embodiments above may be applied to various application fields. For example, the electronic device according to embodiments above may be applied as a logic device or a memory device. The electronic device according to embodiments above may be used for arithmetic operation, program execution, temporary data retention, and the like in devices such as mobile devices, computers, laptops, sensors, network devices, neuromorphic device, and the like. In addition, the capacitors and the electronic devices according to embodiments above may be useful for an apparatus in which a data transmission quantity is large and data transmission is continuously performed.

Figure 10:
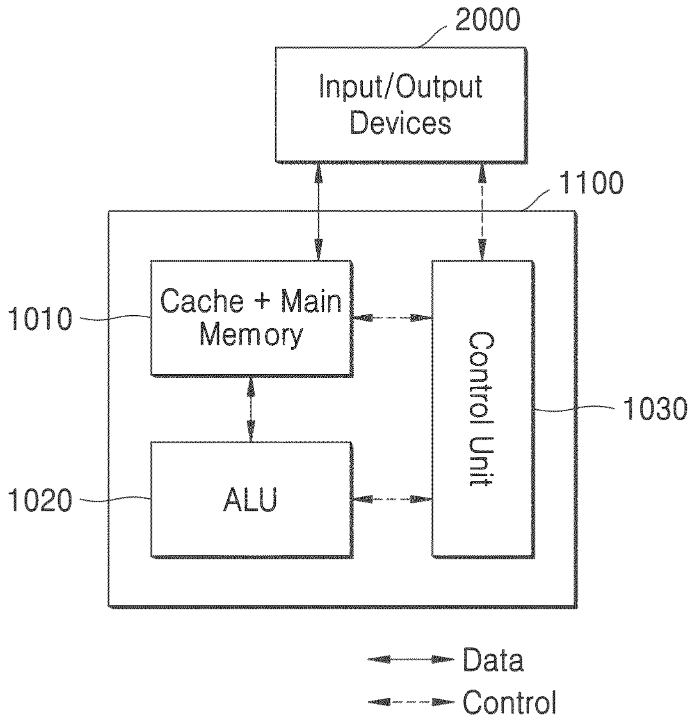
FIGS. 10 and 11 are each a conceptual diagram schematically showing a device architecture that is applicable to a device according to at least one embodiment.
Figure 11:
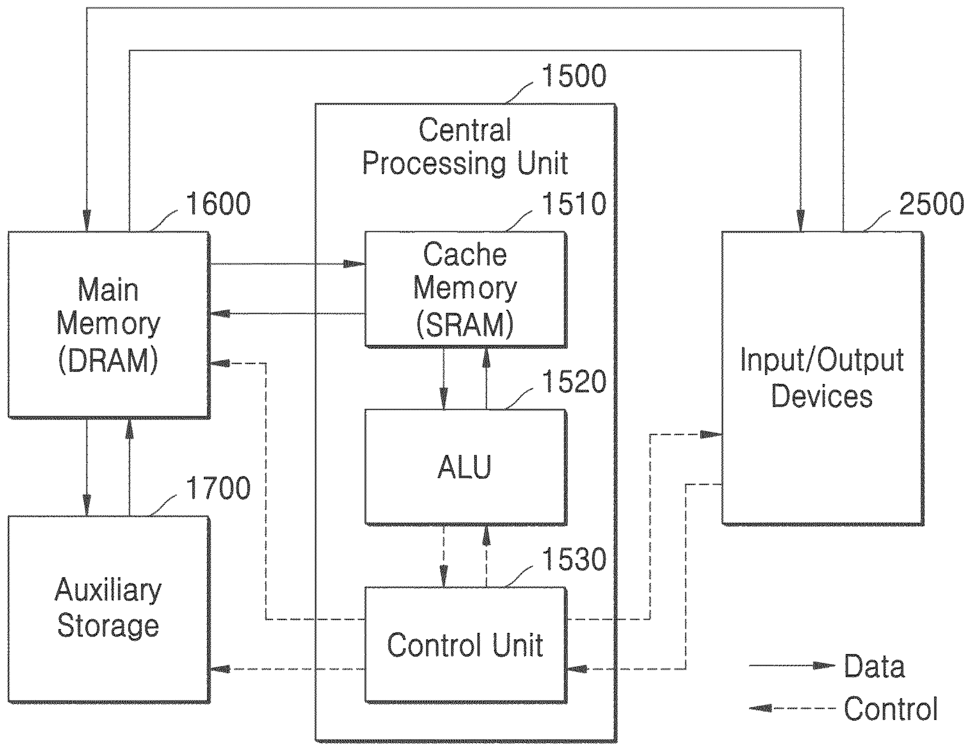

FIGS. 10 and 11 are each a conceptual diagram schematically showing a device architecture that is applicable to a device according to at least one embodiment. Referring to FIG. 10, an electronic device architecture 1100 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1100 may be implemented as a single chip including the memory unit 1010, the ALU 1020, and the control unit 1030.

The memory unit 1010, the ALU 1020, and the control unit 1030 may be connected to each other through on-chip metal lines for direct communication. The memory unit 1010, the ALU 1020, and the control unit 1030 may be monolithically integrated on one substrate to form one chip. The electronic device architecture (e.g., a chip) 1100 may be connected with an input/output device 2000. In addition, the memory unit 1010 may include both a main memory and a cache memory. The electronic device architecture (e.g., a chip) 1100 may be an on-chip memory processing unit. The memory unit 1010 may include the aforementioned capacitor and an electronic device utilizing the same. The ALU 1020 or the control unit 1030 may each include the aforementioned capacitor.

Referring to FIG. 11, a cache memory 1510, an ALU 1520, and a control unit 1530 may constitute a central processing unit (CPU) 1500, and the cache memory 1510 may include a static random access memory (SRAM). Separately from the CPU 1500, a main memory 1600 and a secondary storage 1700 may be provided. The main memory 1600 may be a dynamic random access memory (DRAM), and may include the aforementioned capacitor. In some cases, such an electronic device architecture may be implemented in a form in which computing unit devices and memory unit devices are adjacent to each other in a single chip without distinction of sub-units. Although the embodiments have been described above, these are merely examples, and various modifications will be made therefrom by those skilled in the art.

The aforementioned capacitors and the electronic devices including the same have been described with reference to the embodiments shown in the drawings, but these are merely examples, and those skilled in the art will understand that various modifications and equivalent other embodiments can be made therefrom. Therefore, the embodiments disclosed herein are to be considered in a descriptive point of view rather than a restrictive point of view. The scope of the present specification is indicated in the claims rather than the above description, and all differences within the scope equivalent thereto should be construed as being included in the disclosure.

The aforementioned capacitor has excellent characteristics in blocking/reduction of leakage current while having high electric capacity.

In this regard, an electronic device including such a capacitor is easy to realize high integration, and thus can contribute to miniaturization of the electronic device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:

a lower electrode;

an upper electrode spaced apart from the lower electrode;

a dielectric between the lower electrode and the upper electrode, the dielectric comprising titanium oxide ($TiO_2$) having a rutile phase and magnesium (Mg);

a first layer between the lower electrode and the dielectric, the first layer comprising a material with a work function higher than a work function of a material comprising the lower electrode; and a second layer between the dielectric and the upper electrode, the second layer comprising a dielectric protective material, wherein the second layer comprises an oxide of a second material, and the second material includes at least one of Mg and aluminum (Al).

2. The capacitor of claim 1, wherein the upper electrode and the lower electrode comprise titanium nitride.

3. The capacitor of claim 1, wherein an amount of Mg in the dielectric is greater than about 0.5 at % and less than or equal to about 50 at %, based on 100 at % of the dielectric.

4. The capacitor of claim 1, wherein the dielectric further comprises an additive material, and the additive material comprises gallium (Ga), aluminum (Al), lanthanum (La), boron (B), indium (In), scandium (Sc), yttrium (Y), or any combination thereof.

5. The capacitor of claim 1, wherein the dielectric comprises a $TiO_2$-containing layer, and a Mg oxide-containing layer in the $TiO_2$-containing layer.

6. The capacitor of claim 1, wherein the work function of the first layer is greater than or equal to about 4.0 eV and less than or equal to about 7.0 eV.

7. The capacitor of claim 1, wherein the first layer comprises a first material, an oxide of the first material, a nitride of the first material, or any combination thereof, and the first material comprises molybdenum (Mo), vanadium (V), manganese (Mn), tantalum (Ta), nickel (Ni), tungsten (W), platinum (Pt), palladium (Pd), gold (Au), iridium (Ir), ruthenium (Ru), hafnium (Hf), zirconium (Zr), or any combination thereof.

8. The capacitor of claim 1, wherein a thickness of the first layer is less than or equal to 30 Å.

9. The capacitor of claim 1, wherein the second material is a combination of Mg and Al.

10. The capacitor of claim 1, wherein a thickness of the second layer is less than or equal to 20 Å.

11. The capacitor of claim 1, wherein a sum of a thickness of the second layer and a thickness of the dielectric is less than or equal to 120 Å.

12. The capacitor of claim 1, wherein at least one of the lower electrode, the first layer, the dielectric, the second layer and the upper electrode has an aspect ratio of at least 10:1.

13. A method of preparing a capacitor, the method comprising:

forming a lower electrode;

forming a first layer on the lower electrode, the first layer comprising a material with work function higher than a work function of a material included in the lower electrode;

forming a dielectric on the first layer using an atomic layer deposition (ALD) method, the ALD method including a titanium (Ti)-containing precursor and a magnesium (Mg)-containing precursor such that the dielectric comprising $TiO_2$ having a rutile phase and Mg;

forming a second layer on the dielectric, the second layer comprising a dielectric protective material, the dielectric protective material comprising an oxide of a second material, and the second material includes at least one of Mg and aluminum (Al); and forming an upper electrode on the second layer.

14. The method of claim 13, wherein the forming of the dielectric includes sequentially using the Ti-containing precursor, the Mg-containing precursor, and the Ti-containing precursor.

15. The method of claim 13, wherein the Mg-containing precursor comprises at least one of bis(cyclopentadienyl) magnesium(II) ($Mg(C_5H_5)_2$) or bis(ethylcyclopentadienyl) magnesium ($Mg(CH_4C_2H_5)_2$).

16. An electronic device comprising:

a transistor; and the capacitor of claim 1 electrically connected to the transistor.

17. The electronic device of claim 16, wherein the transistor comprises a semiconductor substrate comprising a source region, a drain region, and a channel region between the source region and the drain region, and a gate stack on the semiconductor substrate, facing the channel region, and comprising a gate insulating layer and a gate electrode.

18. The electronic device of claim 16, wherein the transistor comprises a semiconductor substrate comprising a source region, a drain region, and a channel region being between the source region and the drain region, and a gate stack in a trench in the semiconductor substrate, facing the channel region, and comprising a gate insulating layer and a gate electrode.

19. The electronic device of claim 16, comprising:

a memory unit comprising the capacitor and the transistor; and a control unit electrically connected to the memory unit and configured to control the memory unit.

20. The electronic device of claim 16, wherein the electronic device is a dynamic random access memory (DRAM) device.

* * * * *